United States Patent [19]
Landau et al.

[11] Patent Number: 4,595,452
[45] Date of Patent: Jun. 17, 1986

[54] METHOD AND APPARATUS FOR PLASMA ETCHING

[75] Inventors: Richard F. Landau, Londonderry; Henry A. Majewski, Nashua, both of N.H.

[73] Assignee: Oerlikon-Buhrle U.S.A. Inc., New York, N.Y.

[21] Appl. No.: 710,618

[22] Filed: Mar. 11, 1985

[51] Int. Cl.$^4$ .................... B44C 1/22; C03C 15/00; C03C 25/06
[52] U.S. Cl. .................... 156/643; 156/345; 156/644; 156/646; 156/653; 156/657; 156/659.1; 204/192 E; 204/298
[58] Field of Search ............... 156/643, 644, 646, 653, 156/657, 659.1, 662, 345; 204/164, 192 EC, 192 E, 298; 427/38, 39; 118/728, 50.1, 620

[56] References Cited
U.S. PATENT DOCUMENTS

| | | | |
|---|---|---|---|
| 4,270,999 | 6/1981 | Hassan et al. | 156/345 X |
| 4,328,081 | 5/1982 | Fazlin | 156/345 X |

FOREIGN PATENT DOCUMENTS

| | | | |
|---|---|---|---|
| 0090586 | 10/1983 | European Pat. Off. | 156/345 |
| 0108742 | 8/1980 | Japan | 156/643 |
| 0033834 | 2/1983 | Japan | 156/345 |
| 0019325 | 1/1984 | Japan | 156/643 |

Primary Examiner—William A. Powell
Attorney, Agent, or Firm—Schiller & Pandiscio

[57] ABSTRACT

The invention comprises a novel method and apparatus for plasma etching a semiconductor workpiece so as to produce chamfering at the outer edges of depressions or grooves in the workpiece, e.g., depressions or grooves in a substrate or one or more layers on the substrate. The novel apparatus comprises a first gas feeder means for delivering an etchant gas at a right angle to the workpiece, and a second gas feeder means for delivering an etchant gas at an acute angle to the workpiece.

15 Claims, 4 Drawing Figures

METHOD AND APPARATUS FOR PLASMA ETCHING

The invention pertains to the art of manufacturing semiconductor devices and more particularly to an improved method and apparatus for conducting plasma etching.

PRIOR ART

In the manufacture of semiconductor devices it is common to etch patterns in one or more layers on a wafer or substrate for the creation of specific semiconductor device configurations or in preparation for the further modification of an existing layer or the application of another layer. Thus, for example, in the fabrication of integrated circuits, it is common to etch a selected pattern in an insulating layer (e.g. a layer of $SiO_2$) or a semiconductor layer (e.g. an $N^+$ layer) so as to expose discrete areas of the wafer (or an underlying layer on the wafer) which are to be metallized by the application of a coating of aluminum or some other conductive metal. Sometimes portions of the layer to be etched may be covered with a layer of photoresist material which also must be etched away before metallization can be accomplished.

Frequently the wafer or substrate to be metallized has narrow etched grooves and the metallization step involves step deposition of the metal, i.e., the metal is intended to be deposited in the grooves and also on the adjacent raised surfaces. The ability to properly metallize the wafer or substrate is affected by the cross-sectional configuration of the grooves. If the etching of a layer is not conducted adequately, the grooves may be undersized or imperfect. In any event, the narrow grooves are usually defined by side edge surfaces that extend substantially normal to the substrate, so that the outer corners of the grooves are sharp right angles. As a consequence, a subsequent metallization deposition process frequently is unsatisfactory because the metal layer has discontinuities or excessive variations in thickness where the metal layer extends around the outer corners of the grooves onto the adjacent upper surfaces of the etched layer. Occasionally the narrowness of the grooves coupled with the sharp outer corners results in inadequate metallization of the bottoms of the grooves.

Such metallization defects may cause certain sections of an IC device to be unuseable, or, if the defects are extensive, the entire IC device may be unuseable. By way of example, some or all of the cells of a transistor-type memory device may be rendered unuseable as a consequence of such deposition defects. Defects of the type described above may occur regardless of how the metallization is accomplished, e.g., by evaporation deposition, sputtering or electroless or immersion plating. Similar difficulties may arise where a layer of an insulating or semiconductor material is deposited in the grooves and on the adjacent portions of the upper surface of a etched layer.

OBJECTS OF THE INVENTION

The primary object of this invention is to provide a reliable method and apparatus for improving the etching of grooves so as to eliminate or reduce metallization defects caused by improper etching of grooves or the difficulty of plating the sharp outer corners of grooves.

A secondary object of this invention is to provide an improved etching method and apparatus for the abovedescribed purposes which may be incorporated into a process for manufacturing semiconductor devices without requiring any material alteration of that process.

A specific object of this invention is to provide a novel apparatus and method for producing grooves with chamfered corners by plasma etching.

Another specific object of this invention is to provide an improved etching method and apparatus for the abovedescribed purposes which is (a) relatively easy to execute or operate, (b) reliable both in operation and consistency of results, and (c) relatively inexpensive to use.

These and other objects of the invention are achieved by providing a new method and apparatus for etching semiconductor wafers or substrates so as to obtain chamfering of the corners of the outer edges of grooves which are to be metallized or coated in the manner previously described. The new method involves plasma etching characterized by etchant gas flow at two or more selected angles relative to the wafers. As an optional measure etchant gas flow may be varied in a circumferential mode to provide selective etching at different quadrant positions. If desired operation of the etching apparatus may include variations in etchant gas composition for selective etching of wafer layers. The new apparatus involves the use of a novel gas-feeding means disposed at an acute angle to the plane of a wafer or substrate to be etched, and means for selectively causing etchant gas to be discharged by the novel gas feeding means so as to produce chamfered corners at the the outer edge of grooves formed in the wafer or substrate. The chamfering facilitates the subsequent formation of metal layers in the grooves with adequate metal thickness at the outer corners of the grooves.

Other features and advantages of the invention are described in or rendered obvious by the following detailed description of a preferred embodiment of the invention which is to be considered with the accompanying drawings.

THE DRAWINGS

FIG. 1 schematically illustrates a single wafer etching machine employing the present invention;

PREFERRED EMBODIMENT OF THE INVENTION

Figure 1:
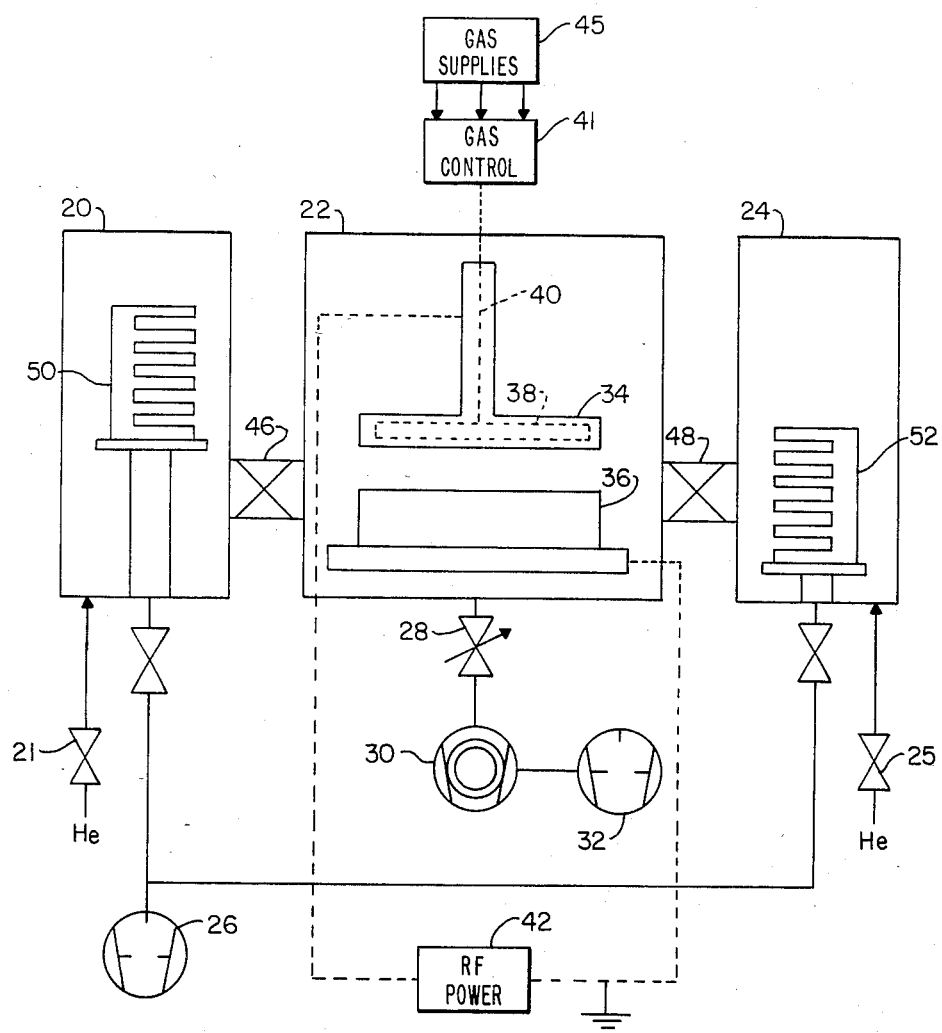

Turning now to FIG. 1, there is shown a single wafer plasma etching machine of a kind well known in the art, e.g., the Balzers Model SWE654 cassette-to-cassette single wafer etching system sold by Balzers, of Hudson, N.H. and Balzers AG of Balzers, Liechtenstein. The illustrated machine comprises a wafer sender chamber 20, a plasma etching chamber 22, and a wafer receiver chamber 24. A selected gas, e.g. an inert gas such as nitrogen, helium or argon, or a mixture thereof, is fed to sender chamber 20 and receiver chamber 24 via flow control valves 21 and 25. The wafer sender and receiver chambers are connected to a rotary vane pump 26 that serves to vent those chambers and maintain them at a suitable vacuum level, typically at a pressure of about 2-5 torr. The etching chamber 22 is connected via a throttle valve 28 to a turbomolecular pump 30 and a second rotary vane pump 32. Pumps 30 and 32 serve to evacuate the etching chamber to a lower pressure than the sender and receiver chambers, typically to a pressure of about $2 \times 10^{-6}$ torr.

The etching chamber 22 contains an upper electrode 34 and a lower electrode 36. Upper electrode 34 contains an internal cavity illustrated at 38 which is connected via a passageway 40 to a process gas control means 41 that is arranged to control the inflow from suitable gas supplies 45 of a mixture of one or more selected etchant gases and a carrier or diluent gas.

The underside of electrode 34 confronting electrode 36 is provided with a plurality of pores or openings (not illustrated in FIG. 1) which allow etchant gas to flow out from cavity 38 into the open space between the two electrodes.

The two electrodes are connected to an RF power supply 42 so that the lower electrode is at RF ground and the upper electrode is at a positive potential. When the power supply is turned on so as to electrically energize the electrodes, the gas mixture introduced via cavity 38 into the region between the two electrodes is converted to a plasma, forming one or more reactive gaseous species that actively etch away selected portions of a wafer supported on the lower electrode.

The wafer sender and receiver chambers 20 and 26 are connected to process chamber 22 by vacuum load lock valves schematically shown at 46 and 48 that that are adapted to allow wafer transport through the system without losing the vacuum in the etching chamber. Sender chamber 20 has a cassette means 50 having a plurality of wafer-receiving cells or compartments for holding a selected number of wafers to be etched, e.g., 25 wafers, one to a cell. Receiver chamber 24 has a similar cassette means 52 with cells or compartments for receiving and holding a like number of wafers removed from process chamber 22. Although not shown, it is to be understood that sender chamber 20 and receiver chamber 26 are provided with cassette elevator means for selectively raising and lowering the cassette means 50 and 52 on command so as to facilitate transfer of wafers to and from process chamber 22 in the manner herinafter described.

Although not shown, it is to be understood further that the single wafer etching machine includes a suitable conveyor system for (a) removing a wafer from cassette means 50 in sender chamber 22 and delivering it to the space between 34 and 36 electrodes, (b) depositing the wafer on the upper surface of lower electrode 36, and (c) removing the wafer on the lower electrode and conveying it to the cassette means 52 in receiver chamber 26. The machine also includes a clamp means (not shown) that is arranged and operated so that it locks a wafer against the lower electrode during the etching operation, and when the etching operation is completed, it releases the wafer for delivery to the conveyor to receiver chamber 24.

Operation of the machine is controlled by a programmable controller, i.e., a computer, (not shown), that is programmed to cause the machine to operate so that wafers are etched one at a time in etching chamber 22 under selected operating conditions.

In an etching operation, a wafer is subjected to plasma etching in etching chamber 22 utilizing a selected etchant gas composition, e.g., (1) a mixture of $C_2F_6$, $CHF_3$ and He may be used to etch an $SiO_2$ layer on the substrate (and any photoresist covering that layer), and (2) a mixture of $Cl_2$, $SF_6$ and He may be used to etch a polysilicon substrate. The etchant gas mixture is delivered to the upper electrode during the plasma etching step with the etching chamber being maintained at a suitable reduced pressure (as herein described) during that operation. An inert gas such as nitrogen, helium or argon, or a mixture thereof, is continually fed to and vented from the wafer sender and receiver chambers via flow control valves 21 and 75 and vane pump 26.

At the beginning of an etching operation, the cassette means 50 is loaded with wafers to be etched while cassette means 52 contains no wafers. Thereafter, sequentially a wafer is fed by the conveyor system (not shown) from cassette means 50 to process chamber 22 for etching, and then when etching has been completed the same wafer is delivered to cassette means 52. Each time the conveyor is operated it (a) feeds an etched wafer from etching chamber 22 to cassette means 52 and (b) simultaneously feeds a new unetched wafer from cassette means 50 to etching chamber 22. By way of example, at the beginning of a multi-wafer etching run, cassette means 50, fully loaded, will be at a first (uppermost) position in which the wafer in its bottommost cell will be in position to be removed therefrom and transported into the etching chamber. Simultaneously, the cassette means 52 will be in a first (lowermost) position in which its upper wafer-receiving cell is in position to receive a wafer transported out of the etching chamber. After a wafer is removed from cassette means 50, the latter is indexed downwardly by its elevator means far enough to position the next wafer for delivery to the etching chamber. Similarly, after a wafer has been removed from the etching chamber and received by cassette means 52, the latter is indexed upwardly by its elevator means just far enough to locate its next empty cell in position to receive the next wafer removed from the etching chamber.

The programmable controller for the machine causes the vacuum load lock valves 46 and 48 to (a) open automatically on command to allow wafers to pass to and from the process chamber, and (b) close automatically when the transfer has been completed, whereupon the machine is set to conduct another etching operation. The machine also includes means (not shown) for equalizing the pressure in the sender and receiver chambers with that of process chamber 22, a necessary requirement for accomplishing transfer of wafers into and out of the process chamber.

Figure 2:
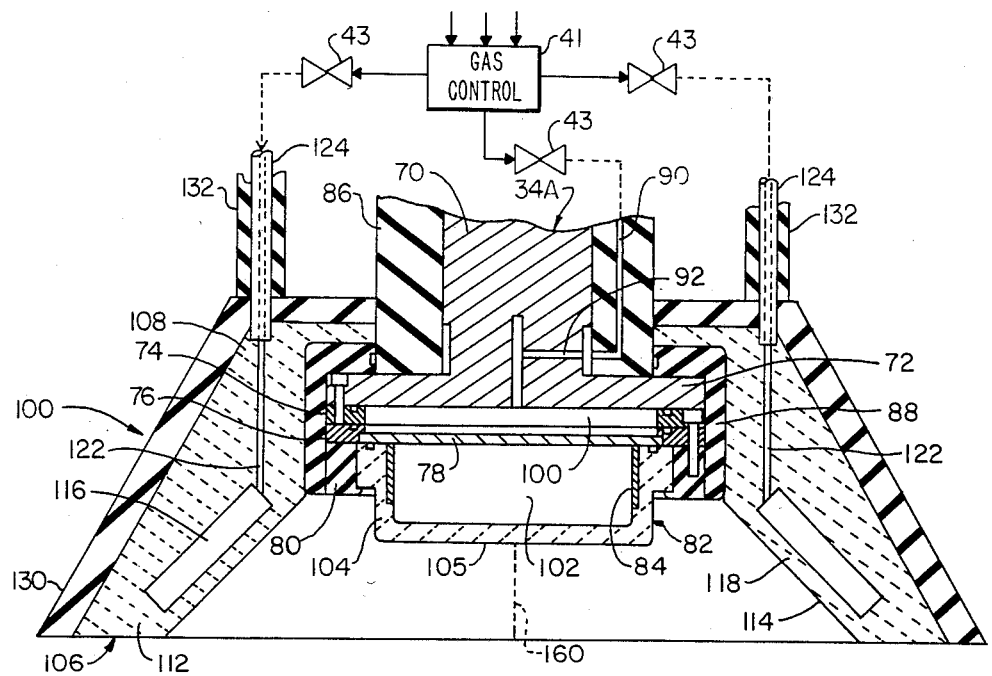
FIG. 2 is a fragmentary sectional view on an enlarged scale of a new upper electrode assembly made in accordance with this invention for use in a wafer etching system, e.g. for use in a machine of the type shown in FIG. 1.

In accordance with this invention, an etching apparatus of the type shown in FIG. 1 may be modified by replacing the upper electrode with an electrode assembly 100 shown in FIG. 2, which is designed so as to discharge etchant gas in at least two discrete directions, one of which is at a right angle to the upper surface of the wafer supported by the lower electrode, and the other of which is at an acute angle to the upper surface of the wafer. The preferred embodiment of the invention comprises an electrode apparatus essentially shown in FIG. 2.

Referring now to FIG. 2, the modified upper electrode assembly 100 comprises an upper electrode member 34A in the form of a cylindrical stem section 70 adapted to be connected to RF power supply 42 and a flange 72 having a flat bottom surface that extends parallel to the upper flat surface of the lower electrode 36 when inserted in place of electrode 34. Releasably attached to flange 72 by screw fasteners are a metal spacer ring 74 and a metal support ring 76 to which is welded a thin sintered stainless steel plate 78 having an average porosity of between about 20 and 50 microns, preferably about 35 microns (i.e., plate 78 has pores with an average diameter of between 20 and 50 microns, preferably about 35 microns). Clamped against the peripheral portion of porous steel plate 78 by a retaining ring 80 made of an electrically insulating material is a disk-shaped porous graphite gas feed member 82 having a porosity not less than 20 microns and not in excess of 50 microns, and an average porosity of between about 25 and 35 microns, preferably about 32 microns. A cylindrical aluminum sleeve 84 on the inside of member 82 serves to reinforce that member and also improve its conductive connection to porous steel plate 78.

A sleeve 86 of electrical insulating material surrounds cylindrical stem section 70 of electrode member 34A and a collar 88 of electrical insulating material surrounds the outer margin of flange 72 and the outer edge surfaces of rings 74 and 76.

Communicating passageways 90 and 92 in insulation sleeve 86 and electrode member 34A serve to introduce etchant gas to the shallow chamber 100 formed between flange 72 and porous plate 78. Under the influence of the vacuum existing in the etching chamber 22, the gas in chamber 100 gas will diffuse easily through plate 78 into the deeper chamber 102 formed between plate 78 and graphite gas feed member 82. Chamber 102 serves as a primary gas manifold for gas feed member 82. Gas in manifold chamber 102 escapes by passing through the pores in the lower section 104 of gas feed member 82. The pores at the outer surface 105 of section 104 act as individual discharge orifices or nozzles, so that gas passing through gas feed member 82 is discharged at outer surface 105 in a myriad of fine streams that flow at a right angle to that surface and also at a right angle to the flat upper surface of lower electrode 36.

In accordance with this invention the upper electrode assembly 100 is provided with an electrically insulated shroud that functions as an auxiliary gas feed means adopted to discharge etchant gas toward lower electrode 36 at an inclined angle to the flat upper surface of the lower electrode. In essence, as will be apparent from the following description, the insulated shroud comprises a gas feed means that is characterized by a plurality of gas discharge pores or orifices arranged in a conical array concentrically with the common center axis of the upper and lower electrodes. The gas discharge pores or orifices in the gas feed means of the insulated shroud have an average diameter between about 20 and 50 microns.

Referring again to FIG. 2, the preferred form of insulated shroud comprises an auxiliary gas feed member in the form of a conically shaped porous graphite shroud 106 having an upper body portion 108 that surrounds and fits snugly against the upper and outer surfaces of insulator member 88, and a lower body portion 112 that extends below graphite gas feed member 82 and has a flat conically shaped inner surface 114 that is concentric with and spaced radially from the lower section 104 of graphite member 82. The auxiliary gas feed shroud 106 has an average porosity of between about 20 and 50 microns so that it can act as an auxiliary gas feed means. Gas feed shroud 106 has a manifold chamber in the form of a blind cavity 116. The cavity is formed so that a thin porous wall portion 118 separates the manifold chamber from the space surrounded by the conical inner surface 114 of the gas feed shroud. Wall portion 118 preferably has a thickness of between about 5 and about 20 mm, so as to assure that it has adequate mechanical strength and also is thin enough to rapidly pass etchant gas from the manifold chamber 116 to the space between the upper and lower electrodes.

At the inner surface 114 of shroud member 106, the pores of the thin wall section 118 act as individual discharge orifices or nozzles, so that gas is discharged from the manifold via that inner surface in the form of a myriad of fine streams that flow at a right angle to inner surface 114. Since the inner surface 114 of shroud shaped gas feed member 106 is inclined at an acute angle to both the flat upper surface of lower electrode 36 and the center axis of the upper electrode, the gas streams discharged from surface 114 are directed toward the upper surface of lower electrode 36 (and any wafer clamped to that upper surface) at an inclined angle.

Gas is supplied to manifold chamber 116 via one or more passageways 122 in gas feed member 106 and one or more conduits 124 that are connected at one end to passageways 122 and at the other end to the gas supplies via process gas control means 41. Suitable valve means 43 interposed in the gas supply conduits of process gas control means 41 permit selective application of etchant gas via the graphite member 82 or shroud member 106.

The auxiliary gas feed member 106 is surrounded by a protective shroud 130 made of an electrically-insulating material. Additionally it is preferred that conduits 124 be surrounded by sleeves 132 of electrically-insulating material. The function of insulating members 130 and 132 is to prevent the occurrence of a glow discharge along the outer surfaces of the conductive shroud-shaped gas feed member 106, whereby when the upper and lower electrodes are energized by the RF power supply, plasma formation will be confined to the region directly between the two electrodes. By so confining the glow discharge, less power is required to produce effective plasma etching of a wafer clamped to lower electrode 36.

The shroud-like gas feed member 106 is made of a material which is resistant to and will not react with (or at least is substantially resistant to or will not react rapidly with) the gaseous etchant for the substrate or layer that is to be etched. By way of example, in the case where the semiconductor substrate is silicon and the system is to be used to etch the substrate or a silicon dioxide or glass or metal layer on the substrate, the shroud is preferably made of porous graphite as described above, but porous titanium or alumina may be used in place of the graphite.

It is to be noted also that the reactive etchant gas or gas mixture may be an isotropic or anisotropic etching agent. By way of example, an isotropic etching gas for a silicon substrate or a silicon dioxide layer may comprise $C_2F_6$ in a helium carrier or diluent gas, whereas an anisotropic etching gas for the same materials may comprise a mixture of 100 parts by volume of $C_2F_6$ and 10 parts by volume of $CHF_3$ diluted with helium.

Following is an example of how it is possible to etch chamfered grooves in a silicon substrate using the present invention.

EXAMPLE

A plurality of silicon wafers are coated with an SiO₂ layer and then a photoresist layer is applied over the SiO₂ layer. Thereafter the photoresist is imaged and developed so as to form a mask that defines openings or grooves exposing selected areas of the SiO₂ layer for etching. The openings or grooves in the photoresist are defined by side edge surfaces that extend at substantially a right angle to the wafers. The wafers are placed in a sender cassette in the sender chamber 20 of a Balzers SWE 654 Cassette-To-Cassette Single Wafer Plasma Etching Machine as shown in FIG. 1, and maintained there is an atmosphere of helium under a pressure of about 0.5 to about 1.5 Torr. Subsequently each wafer in turn is removed from the sender chamber and transported to the reaction vacuum chamber 22 where it is subjected to plasma etching under the conditions hereinafter described, after which it is removed from the reaction chamber and transported to a cassette in the receiver chamber 24.

Each wafer introduced to the reaction chamber is clamped to the lower electrode 36 and held there during the etching operation. The reaction chamber 22 is maintained at a pressure of about 750 millitorr during the etching operation. Additionally a heat exchanger fluid is circulated continuously through a tortuous passageway (not shown) in the lower electrode 36 so as to keep the lower electrode and the clamped wafer at a selected temperature of about 10 degrees C. during the etching operation. Upon seating of a wafer on the lower electrode, a 13.56 MHz RF power supply coupled across the electrodes is energized so as to create an RF field between the two electrodes, and simultaneously $C_2F_6$, $CHF_3$ and helium are introduced by process gas control means 41 to the manifold chamber 102 (via chamber 100) at rates of about 200 SCCM, 20 CCM, and 50 CCM respectively. The two electrodes are spaced apart a distance in the range of about 7 to about 1.4 millimeters and the power supply is operated at a power level of about 150 to 250 watts. The gas flow to manifold chamber 102 is shut off after about 120 seconds. After 1 second after gas flow to manifold 102 is started, $C_2F_6$, $CHF_3$ and helium are introduced by the process gas control means 41 to shroud manifold 116 via conduits 124 at rates of about 200 SCCM, 20 SCCM and 50 SCCM respectively. The gas flow to shroud manifold 116 is terminated at the same time as the flow to gas manifold 102. The power supper is shut off simultaneously with termination of gas flow to the two manifolds.

Thereafter the wafer is unclamped from lower electrode 36 and transported into receiver chamber 24 where it is received by receiver cassette 52, and simultaneously a new wafer is removed from sender cassette 50 and transported into the etching chamber and placed on the lower electrode 36 in the manner previously described. Thereafter the power supply and the gas flows to manifolds 102 and 116 are turned on again to etch the second wafer for the same amount of time as the previous wafer. The process is repeated until all of the wafers in the sender cassette have been etched and transported to receiver cassette 52. The receiver cassette is maintained in an atmosphere of helium under a pressure of about 0.5 to about 1.5 torr until all of the wafers have been etched.

Figure 3A:
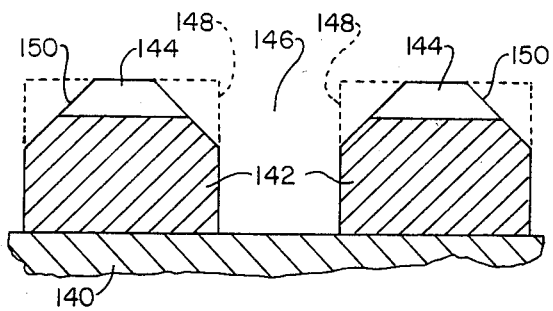
FIGS. 3A and 3B are cross-sectional views on an enlarged scale of portions of an etched semiconductor substrate showing how the outer corners of grooves are chamfered according to the present invention and how the chamfered corners facilitate acceptable deposition of a metal layer in the grooves and on the adjacent portions of the upper surface of the substrate.
Figure 3B:
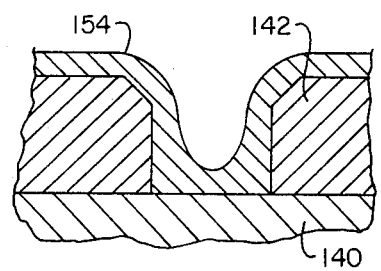

Subsequent inspection of the wafers in the receiver chamber reveals that wherever the photoresist mask defines an opening or groove, the SiO₂ layer in line with the opening or groove has been etched away to form like openings or grooves, except that the outer corners of the openings or grooves in the SiO₂ layers, and also the outer corners of the corresponding openings or grooves in the resist, are chamfered in the manner shown in FIGS. 3A and 3B as a consequence of the etching action of the gas discharged through the inner surface 114 of the shroud-shaped auxiliary gas feed member 106.

FIGS. 3A and 3B illustrate how (a) the outer corners of the photoresist and an SiO₂ layer covered by the photoresist are chamfered as a consequence of use of the present invention, and (b) the chamfering improves subsequent metallization.

FIG. 3A is an enlarged fragmentary view of a silicon substrate 140 having an SiO₂ layer 142 covered with a photoresist layer 144. Under a normal plasma etching operation, the photoresist and substrate layers would be etched so as to form grooves or apertures 146 in the SiO₂ layer 142 and the photoresist layer 144 that would be characterized by edge surfaces 148 (shown in broken lines) that extend at substantially a right angle to the substrate. As a consequence of use of the present invention, the sharp corners of the photoresist and the SiO₂ layer that assist in defining the grooves or apertures in the SiO₂ layer are etched away so as to provide chamfered edge surfaces as shown at 150. FIG. 3B illustrates how the chamfered edge surfaces 150 facilitate deposition of a metal layer 154. Because the sharp corners incurred by normal plasma etching are avoided and replaced by the chamfered surfaces 150, subsequent deposition of a metal layer 154, e.g., a layer of aluminum, may be accomplished so that the metal layer is free of undesired discontinuities, fully fills the grooves or apertures in the SiO₂ layer, and also has a thickness that is substantially more uniform than is the case when metallization is accomplished without chamfering according to this invention.

MODIFICATION OF THE INVENTION

Additionally the machine may be modified further to include means for selectively controlling the flow of etchant gas through different portions of the gas discharge means.

Preferably the shroud-like auxiliary gas feed means 106 is made so as to constitute a single manifold that extends for a full 360 degrees about the common center axis of the two electrodes. However, as an alternative measure, gas feed means 106 may be made in four quadrant (90 degree) sections or discharge nozzle clusters, each with its own manifold chamber 116, in which case each manifold chamber 116 has its own passageway 122 connected to the etchant gas supplies via process gas control means 41 and separate conduits 124 and separate flow control valves (not shown). In such event, adjacent quadrant sections will have flat vertically extending end walls and such end walls will abut one another in the manner represented by line 160 in FIG. 2.

For the above-described modification of the invention, a possible and preferred mode of operation comprises the following steps: causing the etchant gas mixture to be introduced via the orifices of a selected cluster or quadrant of the auxiliary gas feed means 106, feeding the etchant gas mixture through the orifices or nozzles of successive clusters or quadrants on a cluster-by-cluster or quadrant-by-quadrant basis, and (in timed sequence with the preceding step) terminating flow of etchant gas to the orifices or nozzles of other clusters or quadrants on a cluster-by-cluster or quadrant-byquadrant basis. By way of example, the etchant gas mixture may be fed to a first cluster and a second cluster of said orifices or nozzles in series sequence, and the flow of etchant gas to the first fluster may be stopped: (a) before, (b) after, or (c) simultaneously with the initiation of etchant gas flow to the second cluster or quadrant of nozzles. With this mode of operation, it is possible to vary the time period during which etchant gas is discharged by each cluster or quadrant of discharge orifices, and such variation in the operating periods of each cluster or quadrant of discharge orifices makes it possible to vary the degree of chamfering at various points around the periphery of apertures etched in exposed surfaces of layers on a substrate or apertures in an $SiO_2$ layer on the substrate (and optionally apertures in a photoresist layer overlying the $SiO_2$ layer).

Of course, it should be understood that the electrode of FIG. 2 may be modified so as to provide a second auxiliary gas feed means for discharging an etchant gas toward the lower electrode at an angle different than the angle at whick the etchant gas is discharged by auxiliary gas feed means 106.

Additionally, although the gas feed members 82 and 106 have been described as porous members, it is to be understood that they could be made of material that is impervious to the etchant gas mixture, provided that they are processed so as to form micron-sized apertures therein that can function as gas discharge orifices in accordance with the purposes of this invention. Such micron-sized apertures may be formed by means of a laser.

A further variation of the invention is to direct gas to one or both of the two gas feed members 82 and 106 in short, repetitive bursts.

It is to be understood that different gases may be fed to the gas feed members 82 and 106, e.g., an isotropic-acting etchant gas may be discharged by gas feed member 82 and an anisotropic=acting etchant gas may be discharged by gas feed member 106. Also, the timing of the delivery of gases to gas feed member 82 and 106 may be altered, e.g., gas may be delivered to gas feed member 106 before or contemporaneously with delivery of gas to gas feed member 82.

While the invention has been described in connection with a cassette-to-cassette single wafer etching machine of the type shown in FIG. 1, it is to be understood that it is applicable to other plasma etching systems.

Unless otherwise defined herein, it is to be understood that the term "semiconductor workpiece" is to be construed as embracing semiconductor wafers, chips, substrates and the like as they appear at any of the various production stages involved in the manufacture of semiconductor devices. In other words, a "semiconductor workpiece" is to be considered as comprising the starting substrate for a semiconductor device (e.g., a silicon wafer) together with whatever additions or modifications, if any, (e.g., formation of a PN junction or the addition of glass or $SiO_2$ insulating layers) have been made during prior stages of the manufacturing process.

Additionally, the term "semiconductor devices" is to be construed as embracing various types of integrated circuit devices such as central processors, memory units, arithmetic units, etc.

We claim:

1. A improved system for conducting plasma etching of semiconductor wafers comprising:
a process chamber;
first and second electrodes mounted in said chamber and arranged so at least one wafer may be disposed between them for etching;
means for evacuating said chamber;
gas supply means for introducing at least one reactive etching gas to said process chamber;
RF power supply means connected to said electrodes so as to ionize said at least one reactive etching gas and provide a plasma that will impinge upon and etch a wafer located between said electrodes
said first electrode being characterized by (1) a first gas feeder means comprising a plurality of first discharge openings arranged to discharge said at least one reactive etching gas in a plurality of gas streams extending in a direction that is substantially at a right angle to a the plane of a wafer supported on said second electrode, and (2) a second gas feeder means comprising a plurality of second discharge openings each arranged to discharge said at least one reactive etching gas in a direction that is at an acute angle to the plane of a wafer supported on said second electrode;
gas flow control means comprising (a) first means for selectively connecting said first gas feeder means to said gas supply means so that said at least one reactive etching gas will be dispersed via said first discharge openings in a plurality of streams flowing toward said second electrode at a right angle to said second electrode, and (b) second means for selectively connecting said second gas feeder means to said gas supply means so that said at least one etching gas will be dispersed via said second discharge openings in a plurality of streams flowing toward second electrode at an acute angle to said second electrode.

2. A system according to claim 1 wherein said second gas feeder means is arranged so that said at least one etching gas may be fed to different ones of said second openings in a predetermined sequence.

3. A system according to claim 1 wherein said second gas feeder means surrounds said first gas feeder means.

4. A system according to claim 1 wherein said second gas feeder means comprises a porous member that has continuous passageways therein to permit said at least one gas to pass therethrough.

5. A system according to claim 4 wherein said second gas feeder means is in the form of a shroud surrounding said first electrode.

6. A system according to claim 5 further including means electrically insulating a selected portion of said shroud so as to constrict said plasma to the region between said electrodes.

7. A system according to claim 4 wherein said first gas feeder means comprises a porous gas feeder plate attached to said first electrode.

8. A system according to claim 4 wherein said gas flow control means is adapted to cause gas to be introduced to said selected portions of said shroud sequentially according to their respective positions around the circumference of said first electrode.

9. A method of conducting etching of a semiconductor workpiece so as to produce depressions that have chamfered corners, comprising the steps of:

(a) providing a semiconductor workpiece that has a mask on one side thereof defining at least one etching aperture;

(b) placing said workpiece between first and second electrodes disposed in a process chamber so that said workpiece is proximate to said second electrode and said one side thereof faces said first electrode;

(c) coupling an RF power supply across said electrodes so as to create an RF electric field between said electrodes;

(d) selectively feeding a reactive etchant gas (1) through first gas feed means arranged to discharge said gas in a plurality of streams directed toward said second electrode perpendicularly to said one side of said workpiece; and (e) selectively feeding a reactive etchant gas through a second gas feed means arranged to discharge said gas through second feed means arranged to discharge said gas in a plurality of streams directed toward said second electrode at an acute angle to said one side of said workpiece;

whereby the gas streams discharged from said first and second gas feed means are ionized and accelerated toward said second electrode so as to pass through said at least one etching aperture, with the gas streams from said first gas feed means passing through said at least one etching aperture substantially perpendicularly to said one side to cause formation of a depression in said workpiece having sharp outer corners, and the gas streams from said second gas feed means passing through said at least one etching aperture at an acute angle to said one side to cause chamfering of said outer corners.

10. A method according to claim 9 wherein said workpiece mask has a plurality of etching apertures and said first and second gas feed means each comprises a plurality of apertures for discharging gas.

11. A method according to claim 10 wherein said gas is fed to said second gas feed means after is has been fed to said first gas feed means.

12. A method according to claim 9 wherein said second gas feed means comprises a plurality of discharge openings arranged in an array that extends around the periphery of the workpiece.

13. A method according to claim 12 wherein gas is delivered to said first and second gas feed means in a predetermined sequence for short periods of time.

14. A method according to claim 13 wherein gas is delivered to said first and second gas feed means simultaneously.

15. A improved system for conducting plasma etching of semiconductor wafers comprising:

a process chamber;

first and second electrodes mounted in said chamber and arranged so at least one wafer may be disposed between them for processing;

means for evacuating said chamber;

gas supply means for introducing at least one reactive etching gas to said process chamber;

RF power supply means connected to said electrodes so as to ionize said at least one reactive etching gas and provide a plasma that will impinge upon and etch a wafer located between said electrodes said first electrode being characterized by a first gas feeder means for directing a reactive etching gas toward said second electrode at a first angle to said second electrode, and a second gas feeder means for directing a reactive etching gas toward said second electrode at a second angle to said second electrode; and means for selectively connecting said first and second gas feeder means to said gas supply means so that a reactive etching gas may be directed at said second electrode by said first and/or said second gas feeder means.

* * * * *

UNITED STATES PATENT AND TRADEMARK OFFICE
CERTIFICATE OF CORRECTION

PATENT NO. : 4595452

DATED : June 17, 1986

INVENTOR(S) : Richard F. Landau et al

It is certified that error appears in the above-identified patent and that said Letters Patent is hereby corrected as shown below:

Claim 1, column 10, line 1, the word "A" should be -- An --;

Claim 1, column 10, line 13, a semicolon should be inserted after the word "electrodes";

Claim 1, column 10, line 19, the word "a" (second occurrence) should be omitted;

Claim 1, column 10, line 37, the word "said" should be inserted before the word -- second --;

Claim 9, column 11, lines 19 and 20, delete the words "through second feed means arranged to discharge said gas";

Claim 11, column 12, line 2, the word "is" (second occurrence) should be -- it --; and Claim 15, column 12, line 26, a semicolon should be inserted after the word "electrodes".

Signed and Sealed this

Twenty-third Day of September 1986

[SEAL]

Attest:

DONALD J. QUIGG

Attesting Officer

Commissioner of Patents and Trademarks